United States Patent
Lim et al.

(10) Patent No.: US 11,592,892 B2
(45) Date of Patent: Feb. 28, 2023

(54) POWER CONTROL CIRCUITRY FOR CONTROLLING POWER DOMAINS

(71) Applicant: ARM Limited, Cambridge (GB)

(72) Inventors: Seow Chuan Lim, Letchworth Garden City (GB); Dominic William Brown, Ely (GB); Christopher Vincent Severino, Haverhill (GB); Gergely Kiss, Budapest (HU); Csaba Kelemen, Gyor (HU)

(73) Assignee: Arm Limited, Cambridge (GB)

( * ) Notice: Subject to any disclaimer, the term of this patent is extended or adjusted under 35 U.S.C. 154(b) by 450 days.

(21) Appl. No.: 15/593,729

(22) Filed: May 12, 2017

(65) Prior Publication Data

US 2018/0004278 A1 Jan. 4, 2018

(30) Foreign Application Priority Data

Jun. 29, 2016 (GB) .................................. 1611262

(51) Int. Cl.
| | |
|---|---|
| G06F 1/3287 | (2019.01) |
| H03K 19/00 | (2006.01) |
| G06F 1/3246 | (2019.01) |
| G06F 9/4401 | (2018.01) |
| G11C 5/14 | (2006.01) |

(52) U.S. Cl.
CPC .......... *G06F 1/3287* (2013.01); *G06F 1/3246* (2013.01); *G06F 9/4418* (2013.01); *H03K 19/00* (2013.01); *H03K 19/0016* (2013.01); *G11C 5/14* (2013.01); *Y02D 10/00* (2018.01)

(58) Field of Classification Search
CPC ....................................................... G06F 1/3287
See application file for complete search history.

(56) References Cited

U.S. PATENT DOCUMENTS

| | | | |
|---|---|---|---|
| 2010/0231044 | A1 | 9/2010 | Tatsumi et al. |
| 2011/0022859 | A1 | 1/2011 | More et al. |
| 2011/0283130 | A1 | 11/2011 | Pai et al. |

(Continued)

FOREIGN PATENT DOCUMENTS

| | | |
|---|---|---|
| CN | 102656558 | 9/2012 |
| GB | 2472050 | 1/2011 |

OTHER PUBLICATIONS

Combined Search and Examination Report for GB1611262.5, dated Oct. 31, 2016, 7 pages.

(Continued)

*Primary Examiner* — Paul Yen
(74) *Attorney, Agent, or Firm* — Nixon & Vanderhye P.C.

(57) ABSTRACT

A data processing apparatus includes a plurality of power domains controlled by respective power control signals PCS. Power control circuitry includes mapping circuitry which maps a plurality of power status signals PSS indicative of the power status of respective power domains, and received from those power domains, to form the power control signals which are then supplied power domains. The mapping circuitry may be controlled by mapping parameters stored within a memory mapped array. The mapping parameters may specify that a given power control signal is either sensitive or insensitive to the power status of a particular other power domain within the data processing apparatus-2. The mapping parameters may be fixed or software programmable.

18 Claims, 5 Drawing Sheets

(56) References Cited

U.S. PATENT DOCUMENTS

2012/0054511 A1* 3/2012 Brinks .................... G06F 1/26
                                                         713/310
2012/0102348 A1* 4/2012 Muralidhar .......... G06F 1/3287
                                                         713/323
2015/0095681 A1    4/2015 Jouin et al.

OTHER PUBLICATIONS

Examination Report for GB Application No. 1611262,2 dated Oct. 9, 2019, 2 pages.
Office Action for CN Application No. 201710475418.1 dated Jan. 12, 2023, 12 pages.

* cited by examiner

| Power Domain Requests | Power Dependency Sense Inputs ||||||||||
| --- | --- | --- | --- | --- | --- | --- | --- | --- | --- |
| | PD_SYS PPUHWSTATE_ON | PD_PCPUCORE PPUHWSTATE_ON | PD_SCPUCORE PPUHWSTATE_ON | Combined PD_SRAM PPUHWSTATE_ON | PD_CC PPUHWSTATE_ON | EXP0 | EXP1 | EXP2 | EXPN |
| PD_SYS | Conf | Conf | Conf | Conf | Conf | Conf | Conf | Conf | Conf |
| PD_SRAM0, PD_SRAM1, PD_SRAM2, PD_SRAM3 | Conf | Conf | Conf | Conf | 1 | Conf | Conf | Conf | Conf |
| PD_PCPUCORE | Conf | 1 | 0 | 0 | 0 | Conf | Conf | Conf | Conf |
| PD_SCPUCORE | Conf | 0 | 1 | 0 | 0 | Conf | Conf | Conf | Conf |
| PD_EXP0 request | Conf | 0 | 0 | 0 | 0 | Conf | Conf | Conf | Conf |
| PD_EXP1 request | Conf | 0 | 0 | 0 | 0 | Conf | Conf | Conf | Conf |
| PD_EXP2 request | Conf | 0 | 0 | 0 | 0 | Conf | Conf | Conf | Conf |
| PD_EXPN request | Conf | 0 | 0 | 0 | 0 | Conf | Conf | Conf | Conf |

(memory mapped registers: PD_CC, Combined PD_SRAM, EXP0, EXP1, EXP2, ..., EXPN columns)

FIG. 3

POWER CONTROL CIRCUITRY FOR CONTROLLING POWER DOMAINS

BACKGROUND

Technical Field

This disclosure relates to the field of data processing systems. More particularly, this disclosure relates to the control of power domains within a data processing system.

Technical Background

It is known to provide data processing systems including a plurality of power domains. For example, an integrated circuit may be provided with a plurality of power domains respectively containing different functional blocks of the integrated circuit, such as a power domain containing a processor core, a power domain containing a memory, a power domain containing a direct memory access unit, etc. In order, for example, to reduce power consumption, the power status of these different domains may be controlled such that functional blocks that are not required to be active at a given point in time can be placed into a state in which their power consumption is lowered.

The mechanisms and techniques used to control the switching of power domains between different power states themselves consume resources and power. For example, it may be necessary to have a processor core (possibly dedicated) executing program instructions to monitor and control what can be relatively complex relationships between which power domains are in which power states at any given point of time. The overhead associated with power domain control is itself a disadvantage.

SUMMARY

At least some embodiments of the present disclosure provide power control circuitry for controlling power supplied to a plurality of power domains within a processing apparatus, said power control circuitry comprising:

mapping circuitry to map a plurality of power status signals indicative of power status of respective power domains within said plurality of power domains to a plurality of power control signals to control power status of respective power domains within said plurality of power domains.

The power status signals may simply report upon a current existing power status of a power domain, but in some example embodiments, the power status signals may also or alternatively include request signals indicating a current requested power status of a power domain. All these possibilities are encompassed herein.

At least some embodiments of the present disclosure provide power control circuitry for controlling power supplied to a plurality of power domains within a processing apparatus, said power control circuitry comprising:

mapping means for mapping a plurality of power status signals indicative of power status of respective power domains within said plurality of power domains to a plurality of power control signals to control power status of respective power domains within said plurality of power domains.

At least some embodiments of the present disclosure provide a method of controlling power supplied to a plurality of power domains within a processing apparatus, said method comprising:

mapping with mapping circuitry a plurality of power status signals indicative of power status of respective power domains within said plurality of power domains to a plurality of power control signals to control power status of respective power domains within said plurality of power domains.

BRIEF DESCRIPTION OF THE DRAWINGS

Example embodiments will now be described, by way of example only, with reference to the accompanying drawings in which:

FIG. 3 schematically illustrates an example array of mapping parameters;

DESCRIPTION OF EXAMPLES

Figure 1:
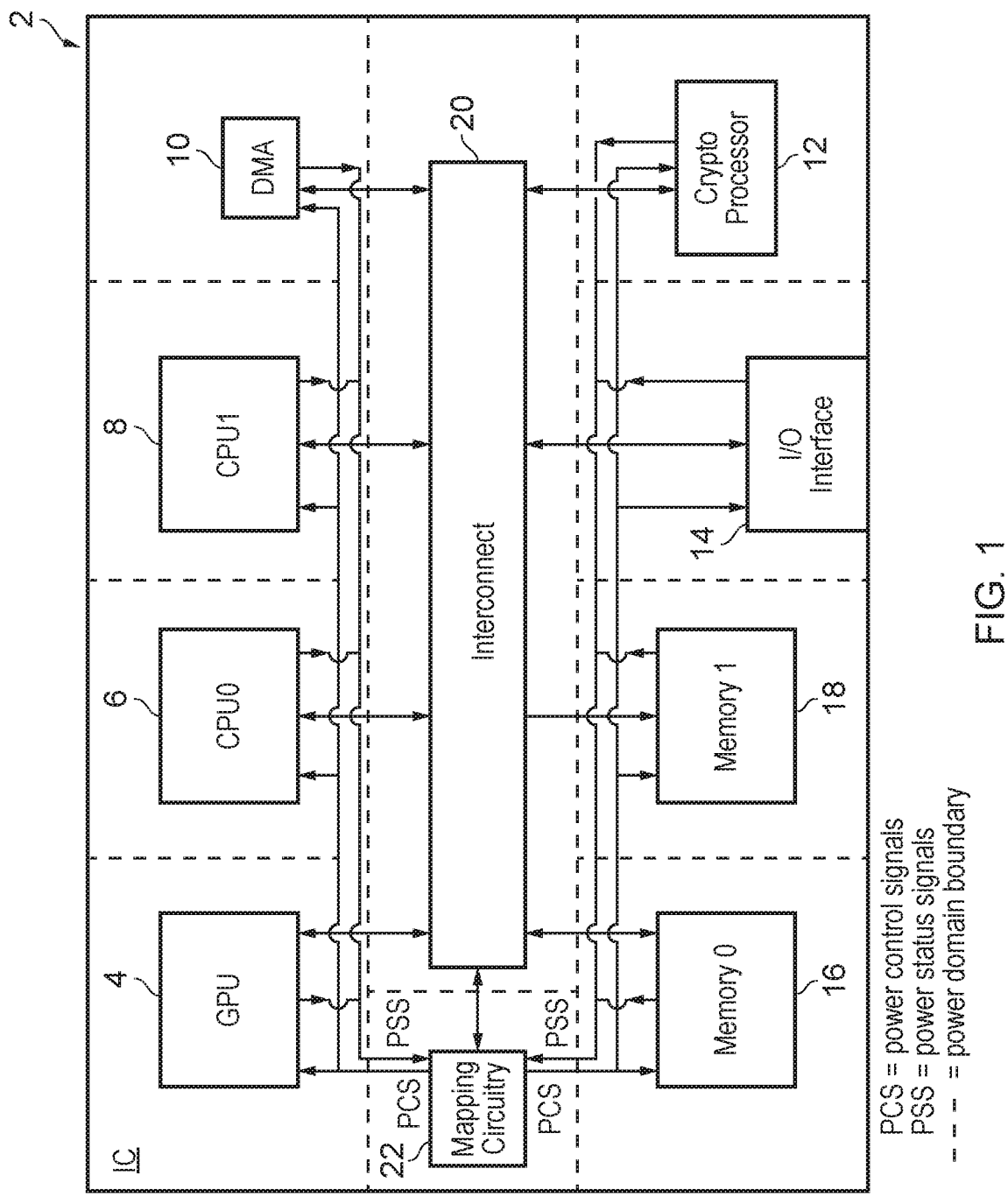
FIG. 1 schematically illustrates an integrated circuit including a plurality of power domains and power control circuitry.

FIG. 1 schematically illustrates a data processing apparatus 2 in the form of an integrated circuit including a plurality of power domains which are shown as separated by the dashed lines in FIG. 1. In this example embodiment the respected power domains contain individual different functional blocks of circuitry, for example a graphics processing unit 4, first general purpose processor 6, a second general purpose processor 8, a direct memory access unit 10, a cryptographic processor 12, an input/output interface 14, a first memory 16, a second memory 18, interconnect (system) circuitry 20 and power control circuitry 22. The power supply to each of these different power domains may be separately controlled to place the circuitry within those respective power domains into a selected one of the plurality of power states. For example, these power states may include a powered power state in which the circuitry within the power domain is powered to perform data processing operations (which can be of a wide variety of different forms), an unpowered state, or a data retention state in which the circuitry within the power domain is able to retain state data but is unable to perform data processing operations until moved into the powered state. It is possible that further different power states may also be employed. For example, different supply voltage levels corresponding to different performance levels available to the processing circuitry within a power domain in a system supporting DVFS (dynamic voltage frequency scaling).

In the example embodiment illustrated in FIG. 1, each of the power domains receives a power control signal PCS from the power control circuitry 22, and sends a power status signal (PSS) to the power control circuitry 22. The power control signals PCS are used to control the power status of the power domain to which they are sent. The power status signals report the current power status of the power domain from which they originate. The power status signals maybe include signals indicating, for example, that the power status of a power domain is currently unpowered, but that the power domain should be transitioned into a powered status in which the circuitry within that power domain is able to perform processing operations. Another example would be that the power status signals could indicate that the power domain is currently powered, in retention only, or OFF. The power status signals may also include additional status signals, like the domain is in idle, or in a lower performance state, or in a higher performance state.

The power control signals PCS and the power status signals PSS transferred from and to the power control circuitry 22, connects to local power control circuitry which is responsible for power control sequencing and control for the power domain it controls. Which will include, for example, handshaking logic within the domain to a safe state, and controlling clock gates, retention control signals, isolation control, reset and power gates. The PCS arriving at a power domain therefore request for the domain to move to the requested power state.

The relationship between which power domains are appropriate to be in which power states for a given overall state of the data processing system may be complex. For example, if one of the general purpose processors 6, 8 is to be powered, then it is appropriate that the interconnect circuitry 20 should also be powered as the general purpose processor 6, 8 would be otherwise unable to do useful work. Furthermore, it may also be appropriate that at least one of the memories 16, 18 should also be powered if one of the general purpose processors 6, 8 is powered. However, in the case that the direct memory access unit 10 is powered, then it may be appropriate that the interconnect 20 is powered, but there is no requirement that any of the graphics processing unit 4, or the two general purpose processors 6, 8 be powered. The relationships between which power domains should be in which state may be fixed for a given hardware implementation of the data processing apparatus 2, but it is also possible that they may vary depending upon the particular processing tasks being performed by the data processing system 2 at any given time. Accordingly, the relationships between which power domains should be in which power states may be at least partially programmable in order to reflect/represent the current processing state/tasks of the data processing apparatus 2.

The power control circuitry 22 as illustrated in FIG. 1 serves as mapping circuitry to map a plurality of power status signals PSS received from respective different power domains, and indicative of the power status of those respective power domains, to a plurality of power control signals PCS which then control the power status of the respective power domains which receive them. The mapping performed may be complex to reflect the relationships existing between the power status requirements of the different power domains as discussed above. These relationships may be fixed or dynamically variable (e.g. software programmable). The mapping circuitry may be configured to represent these complex relationships using a plurality of mapping parameters which specify the relationships between the plurality of power status signals and the plurality of power control signals. These mapping parameters may be provided in the form of a two-dimensional array of mapping parameters (three or more dimensional arrays are also possible). Such an array of mapping parameters may conveniently be provided in the forms of memory mapped registers, such that the mapping of parameters can at least be read by a programmer and some of the mapping parameters written if the system requires that those mapping parameters be dynamically variable. Providing the mapping parameters in the form of an array of memory mapped register values provides a clearly understandable and easily accessed representation of the configuration of the power control circuitry, and the power control provided by that power control circuitry, at a given point in time.

The mapping parameters used by the mapping circuitry can specify different forms of relationship depending upon the values of the mapping parameters. For example, the mapping parameters may specify that a given power control signal is independent of a power status signal, e.g. the power control signal to be supplied to a particular power domain is independent of the power status of some uncorrelated power domain within the data processing apparatus 2 and accordingly is independent of the power status signal of that uncorrelated power domain.

Another value of the mapping parameter may specify that a given power control signal is mapped to a control signal value when a given power status signal has a given power status signal value. For example, if the power status signal of a given power domain, such as one of the general purpose processor cores. 6, 8 indicates that their power domain is powered, then the power control signal for, for example, the interconnect circuitry 20 is mapped to have a control signal value indicating that the interconnect circuitry 20 should be powered. Thus, a mapping parameter having a particular value may specify that when a given power status signal indicates that a particular power domain is powered, then the power control signal for another of the power domains should be set to a value controlling that other power domain to also be powered.

A further example of a value of a mapping parameter is one in which the relationship specified is that a given power control signal should have a given control value which is dependent on a limit value (e.g. a maximum or minimum) from among a given plurality of the power status signals. Thus, for example, the given power control signal for a particular power domain, can be set to correspond to the maximum of the power status signals received from some set of other power domains within the system. For example, the power control signal supplied to the interconnect circuitry 20 could be set to indicate that is should be powered to a performance level which matches the maximum performance level indicated by the power status signals of any of the power domains which are to communicate signals via that interconnect circuitry 20.

As previously mentioned, the mapping parameters may be software programmable or may be fixed for a given hardware implementation. The software programmable parameters may be manipulated by making appropriate writes to memory mapped registers which store the mapping parameters. The mapping parameters may be stored in other ways than in memory mapped registers, such as, for example, within a region of one of the memories 16, 18. Thus, the mapping parameters are software programmable by virtue of being accessible as memory mapped values within the memory address space of the data processing system 2.

Figure 2:
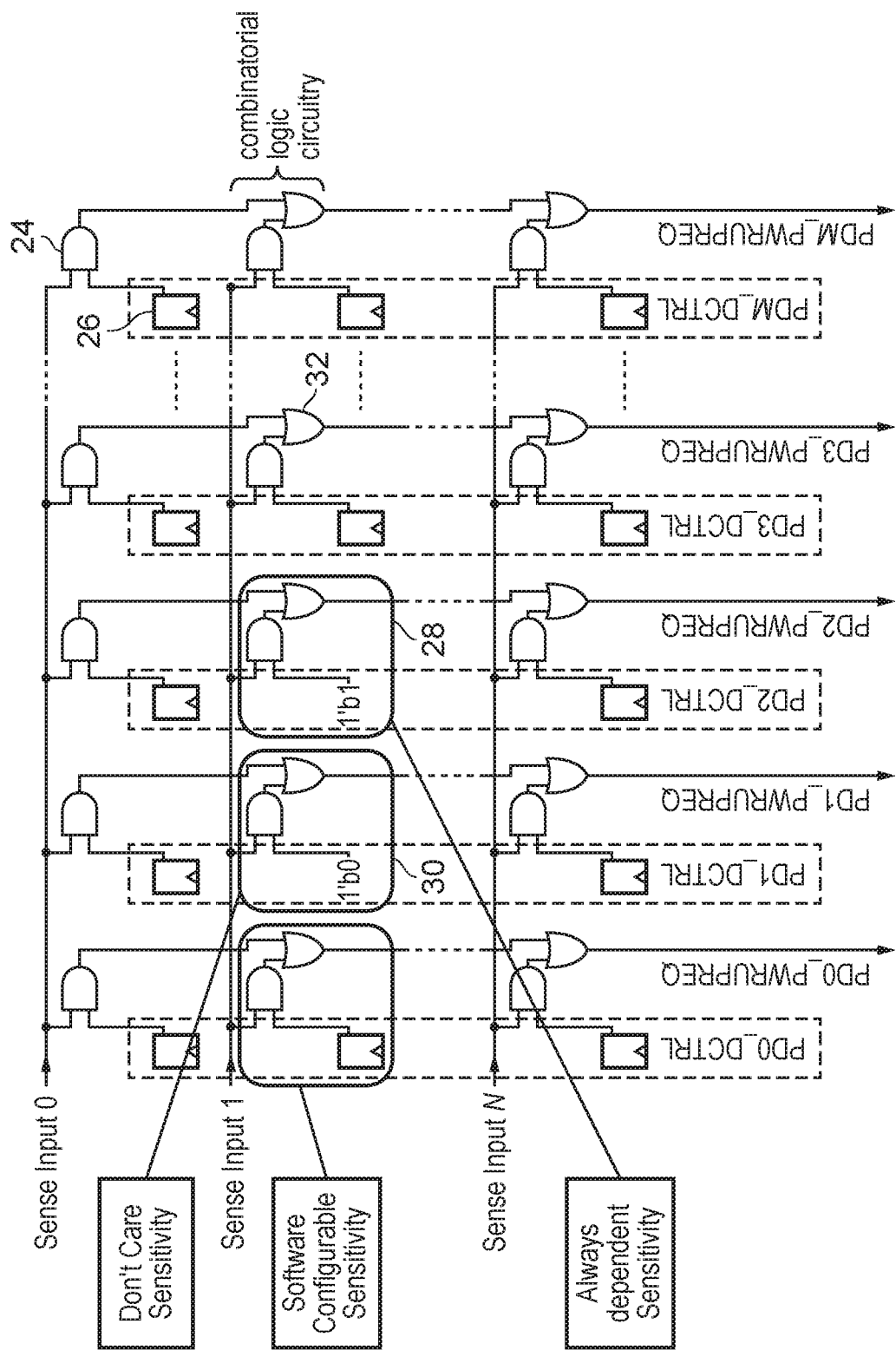
FIG. 2 schematically illustrates a portion of an example embodiment of power control circuitry utilizing a mixture of programmable and fixed mapping parameters to control a mapping between a plurality of power status signals and plurality of power control signals.

FIG. 2 schematically illustrates a portion of a simple example embodiment of the mapping circuitry within the power control circuitry 22. In particular, the mapping circuitry comprises an array of combinatorial logic circuitry serving to map a plurality of received power status signals (sense inputs) into a plurality of power control signals (PDn). In this simple example, a power status signal is high if the power domain from which it originates is powered and is low if the power domain from which it originates is unpowered. An AND gate 24 within each cell of the array of combinatorial logic serves to perform a logical AND between one of the received power status signals and a mapping parameters specified for that array cell. The mapping parameter may be a programmable mapping parameter stored within a programmable latch 26, or may be a fixed parameter such as may be provided by tying one of the inputs of the AND gate 24 either high or low permanently as illustrated for the cells 28, 30.

If the mapping parameter for a given cell is low, then this indicates that the power control signal to be generated in respect of the column within the array containing the cell concerned is not sensitive to the particular power status signal being supplied to that cell (i.e. the power status signal of the given row within the array). Conversely, if the mapping parameter for the cell is high, then this indicates that power control signal for that column will be driven high if the power status signal for the cell is also high. OR gates 32 within each cell serve respectively to perform a logical OR operation upon the output received from the AND gates 24 of the cell in which they are contained and the output of the OR gate the preceding cell of the same column within the array (at least for all cells other than the first in a column whose other input is tied low). Thus, each column within the array generates a power control signal for a particular power domain which is formed as a logical OR of the results of ANDing each of the power status signals for the plurality of domains with respective memory parameters for the different rows within the array intersecting to the column concerned.

Thus, if the power control signal for a given column is a target power control signal, then the mapping circuitry serves to generate a value for that target power control signal to be applied to a corresponding target powered domain such that the target power domain will be switched to an active state (powered) if one or more of the power status signals upon which that target power control signal depends (corresponding to a memory parameter having a high value) indicates that a corresponding power domain are in an active state. Thus, for example, a power control signal which controls the interconnect circuitry 20 may be switched to a state indicating that the interconnect circuitry 20 should be powered if the power status signals received from any of the graphics processing unit 4, the general purpose processors 6, 8 or the direct memory access unit 10 indicate that these are active (powered).

Conversely, the power control signal generated by the mapping circuitry within the power control circuitry 22 which corresponds to a target power control signal may be generated at a level indicating that the target power domain should be inactive if all of the one or more power status signals upon which that target power control signal depends indicate that their corresponding respective power domains are in an inactive state. Thus, the interconnect circuitry 20 is powered down when the power status signals of all of the power domains corresponding to the graphics processing unit 4, the general purpose processors 6, 8, and the direct memory access unit 10 indicate that they are inactive. The inactive state may be one of an unpowered state or a data retention state.

In a data retention state, the circuitry within a power domain retains at least some state data, but is unable to perform data processing operations until it is moved into a powered state (which typically consumes more power).

The power control circuitry 22 and the mapping parameters with which it is configured provide the possibility that the power control signal supplied to a given power domain may be dependent upon the power status signal generated in dependence upon the power status of that same given power domain. Such mapping parameters may be considered to represent "self-controlling parameters". In this case, in the example of the simple combinatorial logic of FIG. 2, if the mapping parameter corresponding to a self-controlling parameter is high, then this will indicate that if the current power status of a given power domain is powered, then the power control signal that will be generated for that given power domain will also be high indicating that the given power domain is controlled to remain powered. In this case, if the self-controlling parameter is software programmable, then it is possible for program control to change the value of the self-controlling parameter away from this high-state, such that it is then possible for that power domain to become unpowered, or enter a retention state, depending upon the other mapping parameters which control the power control signal for that given power domain and the corresponding power status signals for other domains to which the power control signal of the previously self-controlling domain is sensitive.

As previously mentioned, the power control signals may be supplied to their power domains via local power control circuitry that controls the power domain. This local power control circuitry may be responsible for power sequencing and handshaking between different portions of the power domain concerned and communication back to the power control circuitry 22. In such embodiments, the power control signals received from the power control circuitry may comprise wake up signals which are sent to the power domains and serve to trigger a power state transition, such as one from an unpowered, or a data retention state, into a powered state.

The power domains may contain different functional blocks. In the example of FIG. 1 each of the power domains is illustrated as containing one functional block. It is also possible at a given power domain could contain multiple function blocks. For example both of the general purpose processors 6, 8 or both of the memories 16, 18 could be within one power domain for a particular implementation. The functional blocks within the different power domains can take a variety of different forms, and in the example of FIG. 1, these include a general purpose processor, a graphics processor, a cryptographic processor, a direct memory access unit, a memory and an input/output interface.

FIG. 3 schematically illustrates a variety of different mapping parameters that may be used in one example embodiment for controlling the operation of the power control circuitry 22. In this example, the mapping parameters have the form of a two dimensional array. Each column in this array corresponds to a given power status signal received as a sense input from respective power domains. Each row within the array of FIG. 3 corresponds to a power control signal to be generated. In the example of FIG. 3, the first row in the array corresponds to the power control signal PD_SYS which controls the power supply to the system circuitry (e.g. the interconnect circuitry 20). The self-controlling parameter whereby the power control signal for the system is dependent upon the current power status signal for the system is indicated as being configurable (software programmable) in the first entry of the first row in the array. The next four entries in the first row of the array have a value "1" indicating that the power control signal for the system (PD_SYS) will power up the system if the power status signals received from any of the power domains corresponding to these four power status signals indicate that the power domains concerned are powered. The next four entries in the first row of the array indicate that the parameters concerned are software programmable. Thus, the power control signal for the system will power up the system if any of the power domains corresponding to the PCPUCORE, the SCPUCORE, the SRAM, or the cryptographic cell CC are powered. The other dependencies for the power control signal for the system are software configurable.

In contrast to the power control signal for system, consider the power control signal PD_PCPUCORE supplied to the PCPU power domain and corresponding to the third row in the array of FIG. 3. The memory parameters within this row of the array indicate that there is a software configurable dependence upon the power status of the system and there is no dependence upon any of the power status of the PCPUCORE power domain itself, the SCPUCORE, the SRAM, or the cryptographic cell power domains as indicated by the memory parameters with value "0" within this row of the array.

It will be seen that using mapping parameters which map the power status signals to the power control signals with the form of an array as illustrated in FIG. 3 directly represents relationships between the power status signals and the power control signals in a way which is readily understandable and able to be manipulated by a user of the system. The complex relationships which may be provided by the mapping parameters once those mapping parameters are set do not require software programs to be executed to implement the power control strategy which has been set up. This reduces the overhead on the system.

Figure 4:
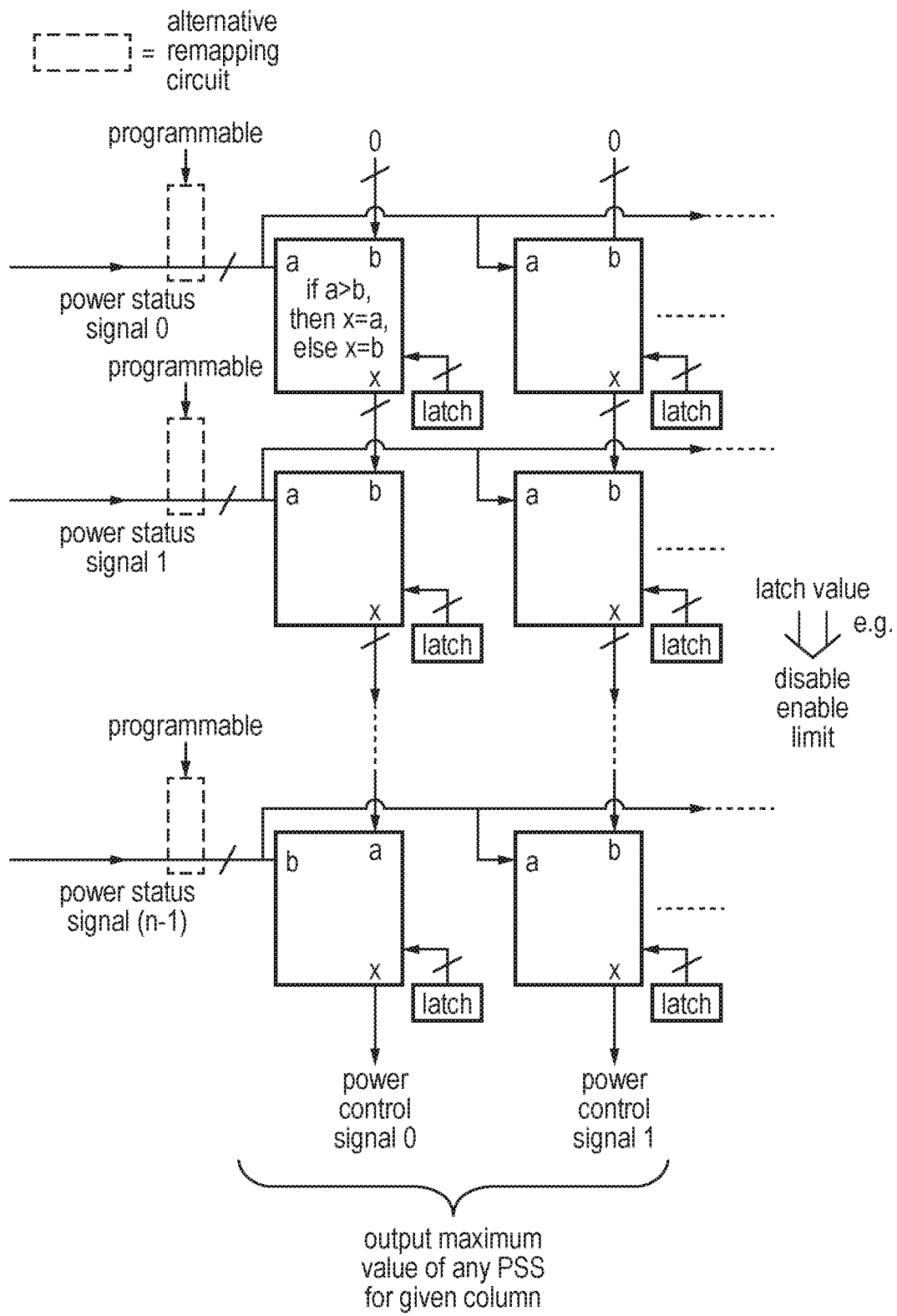
FIG. 4 schematically illustrates another example embodiment of a portion of power control circuitry for mapping a plurality of power status signals to plurality of power control signals.

FIG. 4 schematically illustrates another example form of the mapping circuitry within the power control circuitry 22. In this example the cells at each intersection within the array are illustrated as having behavior corresponding to disabled, enabled or "limit" depending upon the value stored within a programmable latch. These latch values might also in some embodiments be fixed values tied to particular signals by the hardware implementation of the power control circuitry 22. The disabled and enabled states correspond to the sensitive and insensitive states previously described in relation to FIG. 2. The limit state is one in which each cell serves to perform a comparison between a value represented by the power status signal for the row containing that cell and a corresponding power control signal received from a preceding cell from within the column of the array. The larger (or in other embodiments smaller) of these two received values is then passed as the output corresponding to the power control signal from the cell concerned. Thus, if all of the cells within a column are set to this limiting behavior, then the power control signal generated for that column will correspond to the maximum power states signal received at any of the rows within that column.

It is also possible that programmable remapping circuitry may be provided for each cell of the array in a row, or singularly as shown for the entire row of the array and serve to remap the power status signals received into a different form before they are subject to the comparison operations, or simple masking operations, under control of the mapping parameters which configure the individual cells within the array. The use of such remapping of the power status signals prior to processing by the combinatorial logic of the array enables a wide variety of behaviors to be established for the mapping circuitry. In an example embodiment of this mapping for each cell, all cells in the array have the same number of programmable mapping entries, and a single system wide register is used to select for all cells which entries are used. Therefore using a single write the entire system power control array mapping can be change at the same time, reducing software interaction further. In another example embodiment of this mapping for each cell, the cell mapping table is used to remap input power status and requests, allowing the cell's behaviour to disabled, enabled or "limit" the input to operate differently. For example, changing a retention power status to ON status, so that the output request in ON when the input status is retention instead of ON.

Figure 5:
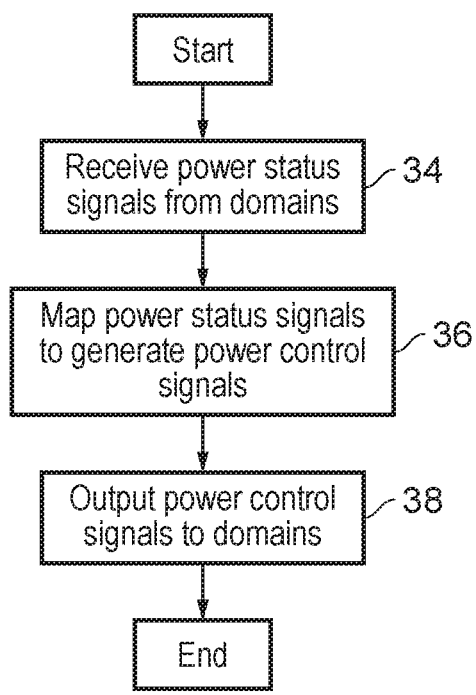
FIG. 5 is a flow diagram schematically illustrating the operation of power control circuitry.

FIG. 5 is a flow diagram schematically illustrating the behavior of the power control circuitry. At step 34 power status signals are received from the plurality of power domains within the data processing apparatus 2. At step 36 these power status signals are mapped in dependence upon the mapping parameters configuring the mapping circuitry of the power control circuitry 22 to generate power control signals. Step 38 outputs the power control signals to their respective power domains within the data processing apparatus 2.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Power control circuitry for controlling power supplied to a plurality of power domains within a data processing apparatus, said power control circuitry comprising:
   mapping circuitry configured to map a plurality of power status signals indicative of power statuses of respective power domains within said plurality of power domains to a plurality of power control signals to control power statuses of respective power domains within said plurality of power domains, wherein said power statuses control respective consumption of said power supplied to said plurality of power domains; wherein
   said mapping circuitry is responsive to a plurality of mapping parameters specifying relationships between said plurality of power status signals and said plurality of power control signals; and
   said plurality of mapping parameters corresponds to a two or more dimensional array of memory-mapped register values within a memory address space of said data processing apparatus.

2. Power control circuitry as claimed in claim 1, wherein said relationships specified by respective values of said mapping parameters specify one or more of:
   a given power control signal is independent of a given power status signal;
   said given power control signal has a given control signal value when said given power status signal has a given status signal value; and
   said given power control signal has a given control value dependent upon a limit of values among a given plurality of said power status signals.

3. Power control circuitry as claimed in claim 1, wherein one or more of said plurality of mapping parameters are software programmable.

4. Power control circuitry as claimed in claim 1, wherein one or more of said plurality of mapping parameters are fixed.

5. Power control circuitry as claimed in claim 1, wherein within said array of mapping parameters said plurality of power status signals corresponds to one of rows of said array or columns of said array and said plurality of power control signals to another of said rows of said array or said columns of said array.

6. Power control circuitry as claimed in claim 1, wherein a target power control signal generated by said mapping circuitry for a target power domain of said plurality of power domains indicates that said target power domain should be in an active state if any one of one or more of said power status signals upon which said target power control signal depends indicates that respective corresponding power domains are in an active state.

7. Power control circuitry as claimed in claim 6, wherein said active state is powered to perform data processing operations.

8. Power control circuitry as claimed in claim 1, wherein a target power control signal generated by said mapping circuitry for a target power domain of said plurality of power domains indicates that said target power domain should be in an inactive state if all of one or more of said power status signals upon which said target power control signal depends indicates that respective corresponding power domains are in an inactive state.

9. Power control circuitry as claimed in claim 6, wherein said inactive state is one of unpowered or in a data retention state to retain state and unable to perform data processing operations.

10. Power control circuitry as claimed in claim 1, wherein said mapping circuitry comprises combinatorial logic circuitry for generating respective ones of said plurality of power control signals in dependence upon logical combinations of one or more of said plurality of power status signals and said plurality of mapping parameters.

11. Power control circuitry as claimed in claim 1, wherein said plurality of mapping parameters include at least one self-controlling parameter to permit specifying a relationship whereby a power control signal for a given power domain within said plurality of power domains is dependent upon a power status signal of said given power domain.

12. Power control circuitry as claimed in claim 11, wherein, when said power status signal of said given power domain indicates that said given power domain is powered to perform data processing and self-controlling parameter for said given power domain has a first value, said power control signal for said given power domain controls said given power domain to remain powered until said self-controlling parameter for said given power domain is changed from said first value.

13. Power control circuitry as claimed in claim 11, wherein said at least one self-controlling parameter is software programmable.

14. Power control circuitry as claimed in claim 1, wherein said plurality of power control signals comprises a plurality of wake up signals to signal corresponding ones of said plurality of power domains to perform a power state transition.

15. An integrated circuit comprising power control circuitry as claimed in claim 1, wherein said plurality of power domains comprises functional blocks within said integrated circuit.

16. An integrated circuit as claimed in claim 15, wherein said functional blocks comprise one or more of:
a general purpose processor;
a graphics processor;
a cryptographic processor;
a direct memory access unit;
a memory; and
an input/output interface.

17. Power control circuitry for controlling power supplied to a plurality of power domains within a data processing apparatus, said power control circuitry comprising:
mapping means for mapping a plurality of power status signals indicative of power statuses of respective power domains within said plurality of power domains to a plurality of power control signals to control power statuses of respective power domains within said plurality of power domains, wherein said power statuses control respective consumption of said power supplied to said plurality of power domains; wherein
said mapping means is responsive to a plurality of mapping parameters specifying relationships between said plurality of power status signals and said plurality of power control signals; and
said plurality of mapping parameters corresponds to a two or more dimensional array of memory-mapped register values within a memory address space of said data processing apparatus.

18. A method of controlling power supplied to a plurality of power domains within a data processing apparatus, said method comprising:
mapping with mapping circuitry a plurality of power status signals indicative of power statuses of respective power domains within said plurality of power domains to a plurality of power control signals to control power statuses of respective power domains within said plurality of power domains, wherein said power statuses control respective consumption of said power supplied to said plurality of power domains; wherein
said mapping circuitry is responsive to a plurality of mapping parameters specifying relationships between said plurality of power status signals and said plurality of power control signals; and
said plurality of mapping parameters corresponds to a two or more dimensional array of memory-mapped register values within a memory address space of said data processing apparatus.

* * * * *